United States Patent [19]
Rothman

[11] Patent Number: 5,495,196
[45] Date of Patent: Feb. 27, 1996

[54] USER CONTROLLED RESET CIRCUIT WITH FAST RECOVERY

[75] Inventor: Daniel J. Rothman, Sunnyvale, Calif.

[73] Assignee: Xilinx, Inc., San Jose, Calif.

[21] Appl. No.: 296,273

[22] Filed: Aug. 25, 1994

Related U.S. Application Data

[63] Continuation of Ser. No. 59,040, May 7, 1993, abandoned.

[51] Int. Cl.$^6$ .............................. H03K 3/356; G05F 1/10
[52] U.S. Cl. ........................... 327/143; 327/208; 327/545
[58] Field of Search .................................. 307/296.4, 279, 307/272.3, 267; 327/545, 208, 143

[56] References Cited

U.S. PATENT DOCUMENTS

| | | | |
|---|---|---|---|
| 4,902,910 | 2/1990 | Hsieh | 307/296 |
| 5,109,163 | 4/1992 | Bernhamida | 307/272.3 |
| 5,159,206 | 10/1992 | Tsay et al. | 307/272.3 |
| 5,446,404 | 8/1995 | Badyal et al. | 327/545 |

FOREIGN PATENT DOCUMENTS

| | | | |
|---|---|---|---|
| 0260593 | 9/1988 | German Dem. Rep. | 307/272.3 |

*Primary Examiner*—Margaret Rose Wambach
*Attorney, Agent, or Firm*—Skjerven, Morrill, MacPherson, Franklin & Friel; Jeanette S. Harms

[57] ABSTRACT

The present invention allows initializing operations such as loading configuration data and preloading registers to begin before a user has released a reset signal. A circuit is provided which responds to the leading edge of a user's reset signal to generate an internal reset signal which begins the initializing operation. The circuit simultaneously starts a delayed signal which ends the internal reset signal. If the MRX signal is long, the chip becomes ready for operating upon release of the MRX signal, whereas if the MRX signal is short, the chip becomes ready for operating upon completion of any steps necessary for resetting the chip. In either case, after a reset signal is received, the chip becomes ready for operation in a shorter time than with the prior art circuits.

11 Claims, 3 Drawing Sheets

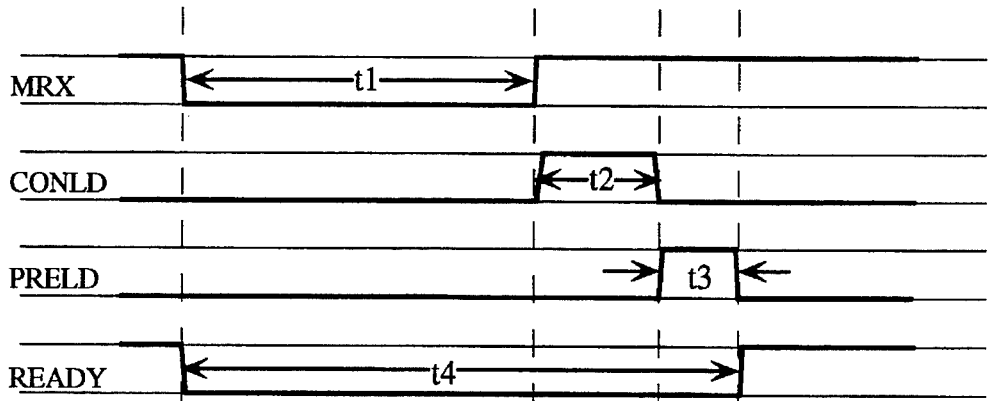
PRIOR ART FIG. 4
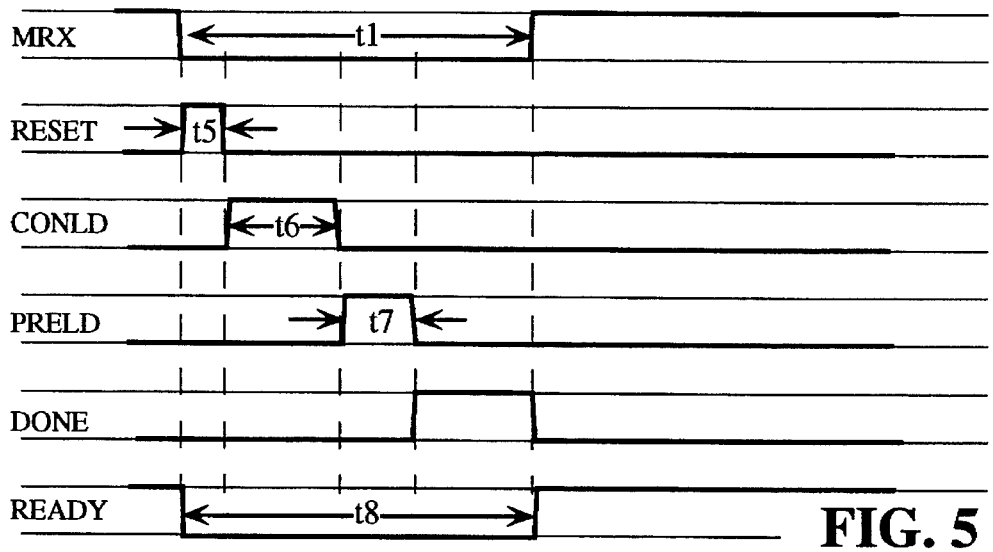
FIG. 5
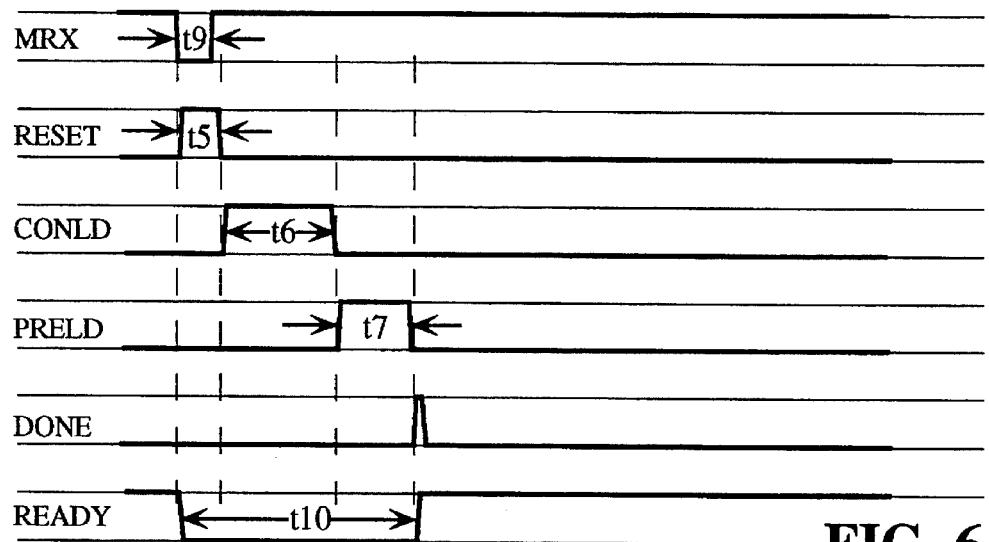
FIG. 6

5,495,196

USER CONTROLLED RESET CIRCUIT WITH FAST RECOVERY

This application is a continuation of application Ser. No. 08/059,040, filed May 7, 1993, now abandoned.

FIELD OF THE INVENTION

The invention relates to reset circuits for integrated circuit devices.

BACKGROUND OF THE INVENTION

When power is applied to an integrated circuit device, a power-on reset circuit typically holds the device in a known state, sometimes maintaining elements of the device in a high impedance state, until voltage has risen to a level at which elements of the device are known to operate properly. The reset circuit then typically releases the device from its reset state so that it can begin operation. Integrated circuit devices also typically include means for a user or some part of the device to provide a reset signal during operation, so that the device may be reset without removing power. Typically, a user reset can be invoked by asserting a specific signal on a user pin. For example, this pin may be normally held in a logical high state but when brought to a logical low level (active low reset), the signal on the pin causes the device to be reset.

FIG. 1 shows a prior art circuit for controlling a user programmable logic device in which configuration data are loaded and registers are preset in response to a reset signal. The circuit of FIG. 1 uses an OR gate 14 with one inverted input to combine an output signal from Vdd detect circuit 11 with a user-generated master reset signal MRX on line 13 to generate a global reset signal on line 15. FIG. 1A shows a circuit associated with FIG. 1. AND gate 101 receives the MRX signal on line 13 and also receives the RESET signal on line 15. In addition to these two signals, in one embodiment AND gate 101 also receives two additional signals CONLD and PRELD. The CONLD signal indicates that configuration data are being loaded into the chip and the PRELD signal indicates that registers in the chip are being preset. FIG. 4 shows a timing diagram associated with the circuit of FIGS. 1 and 1A. As shown in FIG. 4, the READY signal responds to the low-going MRX signal by also going low. AND gate 101 provides a low output signal, which places the chip into a not-ready state in which no processing occurs and outputs are in a high impedance state. When the MRX signal again goes high after time t1, RESET goes low such that AND gate 101 can respond to other signals. The high-going edge of the MRX signal causes the CONLD signal to go high, which initiates loading of configuration data. After time t2, when loading of configuration data is complete, the CONLD signal goes low, which causes the PRELD signal to go high, in turn initiating preloading of the registers during time t3. But a high CONLD signal and a high PRELD signal cause AND gate 101 to maintain the chip in a not ready state (the READY signal remains low) until configuration data have been reloaded into the chip and internal registers have been preloaded. Only when the PRELD signal again goes low can the READY signal again go high, placing the chip into operating condition.

In some applications, the timing sequence of FIG. 4 produces an undesirable delay t4 before the chip can be put into operation. Therefore it is desirable to reduce the time t4 the READY signal is held low.

SUMMARY OF THE INVENTION

The present invention allows initializing operations such as loading configuration data and preloading registers to begin before a user has released a reset signal. A circuit is provided which responds to the leading edge of a user's reset signal to generate an internal reset signal which begins the initializing operation. The circuit simultaneously starts a delayed signal which ends the internal reset signal.

If the MRX signal is long, the chip becomes ready for operating upon release of the MRX signal, whereas if the MRX signal is short, the chip becomes ready for operating upon completion of the configuration and preloading steps in an embodiment such as discussed above, or upon completion of other steps necessary for resetting the chip. In either case, after a reset signal is received, the chip becomes ready for operation in a shorter time than with the prior art circuits.

BRIEF DESCRIPTION OF THE DRAWINGS

FIG. 4 shows a timing diagram for a programmable logic device which is reset by the prior art circuit of FIGS. 1 and 1A.

FIGS. 5 and 6 show timing diagrams for a programmable logic device which is reset by the circuit of the present invention.

DETAILED DESCRIPTION OF SOME EMBODIMENTS OF THE INVENTION

Figure 1:
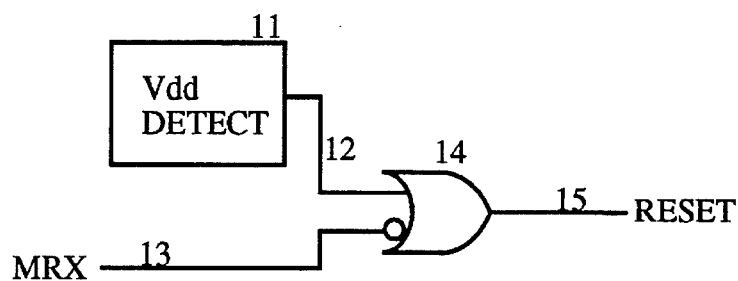
FIG. 1 shows a prior art circuit which provides a reset signal in response to power-up or user reset.
Figure 1A:
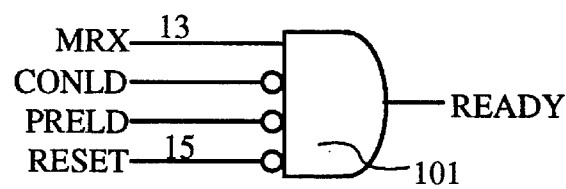
FIG. 1A shows a circuit which works with the circuit of FIG. 1 to generate a READY signal.
Figure 2:
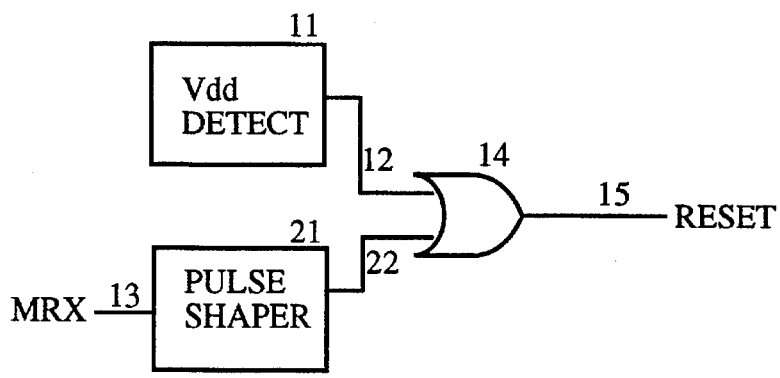
FIG. 2 shows a circuit according to the present invention which provides a reset signal in response to power-up or user reset.

FIG. 2 shows a circuit for controlling a user programmable logic device in accordance with the present invention. A pulse shaper 21 takes a reset signal MRX and generates a reset pulse of a given time duration in response to reset signal MRX. The timing diagrams of FIGS. 5 and 6 show the improvement achieved by the present invention with respect to the prior art. Whereas in the prior art circuit controlled by the MRX signal, loading of the configuration data and preloading of registers could begin only upon release of the MRX signal (see FIG. 4), the present invention uses a delay signal initiated by the MRX signal to initiate the reset operation. As shown in FIG. 5, a RESET pulse t5 is generated by the MRX signal. The down-going edge of the RESET pulse causes any resetting procedures which are needed in the chip to commence. In the embodiment for configuring a chip which was discussed in the background section above, the state machine processes the reset signals CONLD and PRELD. Other required reset operations can also be initiated in response to this brief RESET signal. When complete, the state machine generates the signal DONE. The DONE signal remains high as long as the MRX signal is low.

As shown in FIG. 5, the RESET pulse t5 initiates loading of configuration data during time t6. Completion of configuration data loading initiates preloading of the registers during time t7. If preload completes before MRX is released (as shown in FIG. 5), the circuit returns to operation upon release of MRX. If MRX is released before preload has completed (as shown in FIG. 6), the circuit returns to operation upon completion of preload. In either case, the time-not-ready is decreased compared to the prior art. The DONE signals shown in FIGS. 5 and 6 will be discussed further below.

Figure 3:
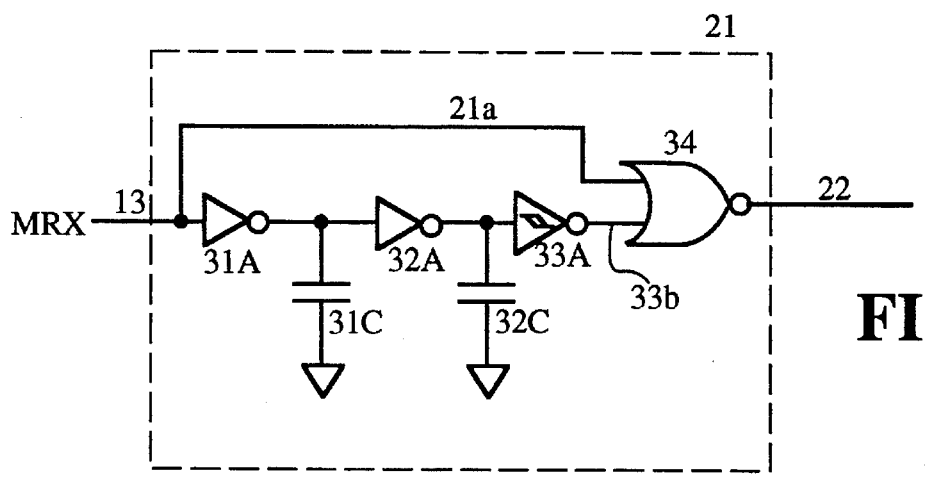
FIG. 3 shows one embodiment of a pulse shaper circuit which can be used with the circuit of FIG. 2.

FIG. 3 shows a pulse shaper circuit for use with the current invention. In normal operation, the MRX signal on line 13 is high, which means that the high input on line 21a to NOR gate 34 causes the output on line 22 to be low. In this condition, the output of inverting Schmitt trigger 33A is low, since an odd number of inverters are positioned between MRX line 13 and line 33b. When the MRX signal on line 13 switches from its normal high (operational) state to a logical low state, the combination of low signals on lines 21a and 33b causes NOR gate 34 to generate a high output signal on line 22. Also in response to the low-going signal on line 13, the output of inverter 31A switches from low to high. However the voltage shift is delayed by capacitor 31C. Thus there is a delay before the high going input of inverter 32A causes inverter 32A to produce a low output signal. Again the output of inverter 32A is delayed in switching by capacitor 32C. Thus there is a delay before the input of inverting Schmitt trigger 33A reaches the rising trigger point. When inverting Schmitt trigger 33A places a high signal on line 33b, the output of NOR gate 34 on line 22 returns low. Thus a low MRX signal of any duration produces a high-going RESET pulse of a standard duration t5 determined mainly by the sizes of capacitors 31C and 32C and the resistances of inverters 31A, 32A and 33A. This reset pulse duration t5 must be sufficient to allow all state changes caused by the RESET pulse to settle out. The low-going edge of the RESET pulse initiates the remaining resetting activities, the reset operation can be completed sooner. In the example of FIG. 5, all resetting activities are complete before MRX goes high, so that the READY signal may return high as soon as MRX goes high.

Figure 7:
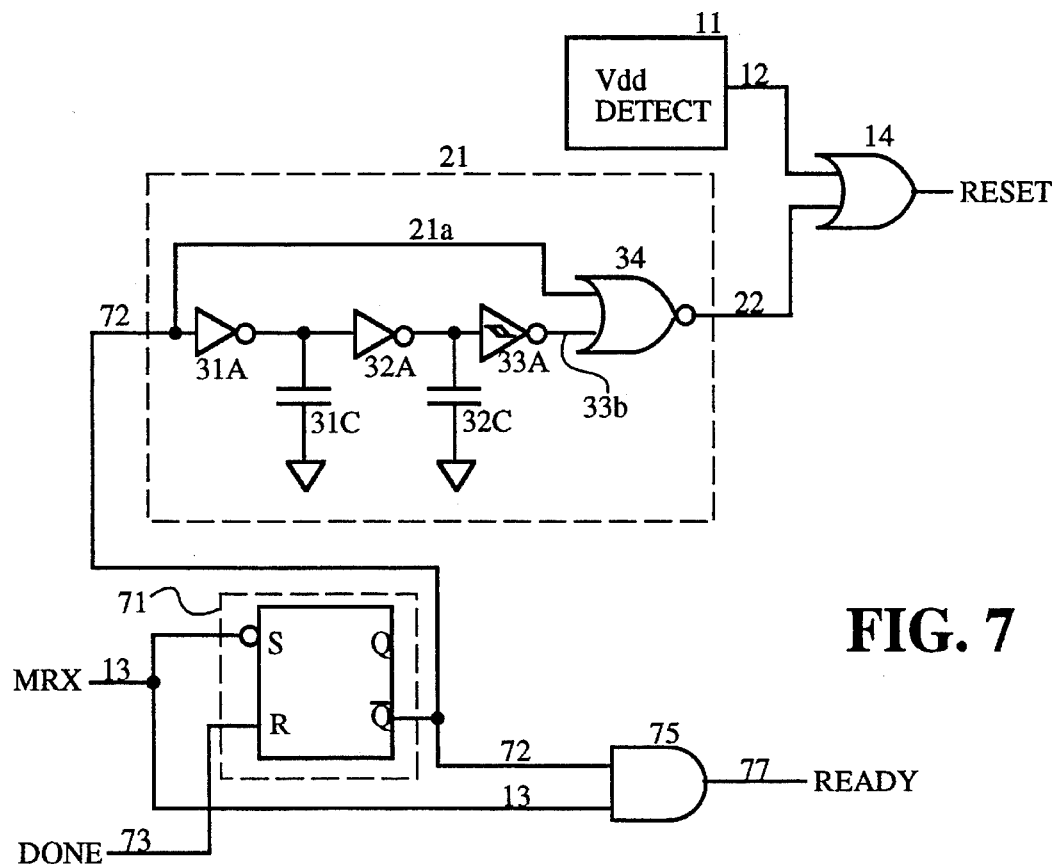
FIG. 7 shows a circuit of the present invention which resets the chip in response to a user-generated reset signal of any length.

FIG. 7 shows an embodiment of the invention which includes a set/reset latch and can therefore properly respond to a MRX signal of any length. As before, the MRX signal is normally high. When MRX goes low, line 13 provides a low input to AND gate 75, which produces a low not-ready signal on line 77. Assuming the DONE signal is in its normal low state, the low MRX signal on line 13 also causes set/reset latch 71 to be set, so that set/reset latch 71 provides a low $\overline{Q}$ output signal. This low signal is also provided to AND gate 75. The output on line 72 remains low until a DONE signal on line 73 (which may be generated, for example, by a low-going preload signal or by another signal which signifies the end of a reset operation) goes high. The low $\overline{Q}$ output signal causes circuit 21, after a given delay, to generate a high pulse on line 22, as discussed above for FIG. 3. This pulse initiates any necessary reset operations, for example the configuration and register loading discussed above. In other circuits, other reset operations will take place. The particular reset operations depend upon the chip or the system being controlled by the reset signal. Other such embodiments are intended to fall within the scope of the present invention.

The embodiment of FIG. 7 generates a high READY signal only when MRX is high and when the DONE signal has generated a high pulse, thereby resetting set/reset latch 71.

Figure 7A:
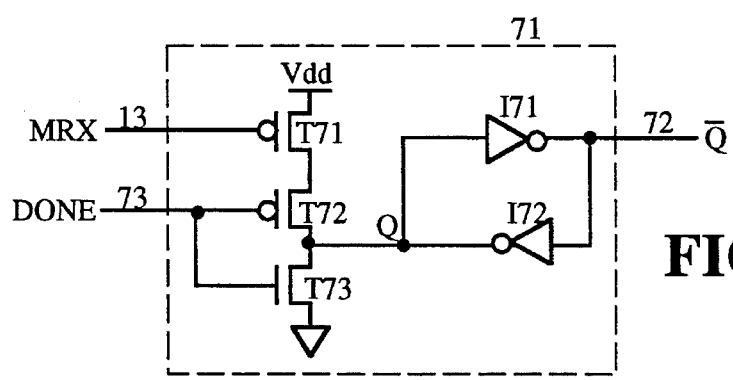
FIG. 7A shows a preferred implementation of the set/reset latch in FIG. 7.

FIG. 7A shows one embodiment of set/reset latch 71. It is important for this operation that the DONE signal provide primary control of the latch. Since DONE is low most of the time, set/reset latch 71 is able to respond to the MRX signal most of the time. When DONE is low, transistor T73 is off and transistor T72 is on. A high signal on MRX causes transistor T71 to be off, which provides a high impedance to the Q terminal of the latch comprising inverters I71 and I72. Thus the latch will remain in its previous state. A high DONE signal will turn on transistor T73 and turn off transistor T72, thus pulling low the Q terminal of the latch and producing a high $\overline{Q}$ output signal. When DONE again goes low, $\overline{Q}$ remains high as transistor again turns off. When DONE is low, transistor T72 is on, therefore a low MRX signal, which turns on transistor T71, pulls up the Q terminal of the latch, producing a low $\overline{Q}$ output signal on line 72.

If a user has held MRX low over an extended period of time so that reset operations have been completed (see timing diagram of FIG. 5), the completion of reset operations will be indicated by a high DONE pulse. In this situation, transistor T71 is on. The high DONE pulse turns off transistor T72 and turns on transistor T73 so that a low signal is applied to the Q terminal of the latch. This causes the latch to be reset in spite of the fact that MRX is still low. Thus DONE overrides MRX. If DONE were to go low before MRX goes low, transistor T72 would turn on. And since transistor T71 would still be on, Q would again go high and $\overline{Q}$ again go low. This low-going $\overline{Q}$ pulse would propagate through circuit 21, generating another RESET pulse and restarting the resetting cycle. To avoid this, other circuitry not shown holds DONE high until MRX again goes low.

FIG. 6 shows a timing diagram which results from the circuit of FIGS. 7 and 7A in response to a very short MRX low signal. The RESET pulse has the same duration t5 as before. The CONLD and PRELD signals also have the same duration. The DONE signal is simply a short pulse. It can be seen in FIG. 7A that since MRX is high and transistor T71 is off when DONE occurs, that Q, which was high, goes low and $\overline{Q}$ goes high. The high-going value of line 72 does not generate a RESET pulse in circuit 21, because line 21a goes high before line 33b goes low, so that the output on line 22 of NOR gate 34 remains a steady low. However, since MRX is high, and line 72 is high, AND gate 75 provides a high READY output signal, and the circuit is placed into operation after time delay t10.

The embodiments described above are illustrative only and not limiting. Other embodiments within the scope of the present invention will be apparent to those skilled in the art. The present invention is set forth in the appended claims.

I claim:

1. A reset circuit for providing a global reset signal comprising:

means for providing a VDD detect signal;

means for generating a reset pulse in response to a user-generated master reset signal;

means for shaping said reset pulse and outputting a modified reset pulse; and means for receiving said VDD detect signal and said modified reset pulse, providing an OR function, and outputting said global reset signal.

2. A reset circuit for providing a global reset signal comprising:

means for providing a VDD detect signal;

means for generating a reset pulse in response to a master reset signal;

means for shaping said reset pulse and outputting a modified reset pulse; and a logic device for receiving said VDD detect signal and said modified reset pulse, said logic device outputting said global reset signal, wherein said means for generating includes a set/reset latch.

3. A reset circuit as in claim 2 wherein said means for shaping includes means for delaying said reset pulse.

4. A reset circuit for providing a global reset signal comprising:

means for providing a VDD detect signal;

means for generating a reset pulse in response to a master reset signal;

means for shaping said reset pulse and outputting a modified reset pulse; and a logic device for receiving said VDD detect signal and said modified reset pulse, said logic device outputting said global reset signal, wherein said means for shaping comprises:

a logic gate;

a first path for providing said reset pulse to said logic gate; and a second path for providing an inverted, and delayed reset pulse to said logic gate, said second path including a plurality of inverters connected in series and a plurality of capacitors, each capacitor having one terminal connected between two of said plurality of inverters and having another terminal connected to a first voltage source.

5. A reset circuit as in claim 1 wherein said means for shaping comprises:

a logic gate;

a first path for providing said reset pulse to one input terminal of said logic gate; and a second path for delaying and inverting said reset pulse and providing the delayed and inverted reset pulse to another input terminal of said logic gate, wherein said logic gate outputs said modified reset pulse.

6. A reset circuit for providing a global reset signal comprising:

means for providing a VDD detect signal;

means for generating a reset pulse in response to a master reset signal;

means for shaping said reset pulse and outputting a modified reset pulse; and a logic device for receiving said VDD detect signal and said modified reset pulse, said logic device outputting said global reset signal, wherein said means for generating a reset pulse comprises:

a two-input logic gate;

means for providing the inverse of said master reset signal to one input terminal of said two-input logic gate; and means for providing a delayed version of said master reset signal to the other input terminal of said two-input logic gate.

7. A reset circuit as in claim 4 wherein said second path of said means for shaping further includes a Schmitt trigger connected between said plurality of inverters and said logic gate.

8. A reset circuit as in claim 4 wherein said logic gate is a NOR gate.

9. A reset circuit for providing a global reset signal comprising:

means for providing a VDD detect signal;

means for generating a reset pulse in response to a master reset signal;

means for shaping said reset pulse and outputting a modified reset pulse; and a logic device for receiving said VDD detect signal and said modified reset pulse, said logic device outputting said global reset signal, wherein said logic device is an OR gate.

10. A reset circuit for providing a global reset signal comprising:

a VDD detect circuit for providing a first signal;

a set/reset latch for receiving an external reset signal and providing a reset pulse;

a pulse shape circuit for receiving said reset pulse and providing a modified reset pulse; and a logic device for receiving said VDD detect signal and said modified reset pulse, said logic device providing said global reset signal.

11. A reset circuit comprising:

means for providing an OR function and generating a global reset signal;

detect circuitry for detecting a predetermined voltage and providing a detect signal to said means for providing;

means for receiving a user-generated reset signal; and means for delaying said user-generated reset signal and providing a delayed user-generated reset signal to said means for providing, wherein an edge of said user-generated reset signal triggers an edge of said global reset signal, and wherein the second edge of said global reset signal is determined by said means for delaying.

* * * * *

UNITED STATES PATENT AND TRADEMARK OFFICE
CERTIFICATE OF CORRECTION

PATENT NO. : 5,495,196
DATED : February 27, 1996
INVENTOR(S) : Daniel J. Rothman It is certified that error appears in the above-identified patent and that said Letters Patent is hereby corrected as shown below:

Col. 1, line 59, delete "not ready" and insert --not-ready--.

Col. 3, line 50, delete "$\overline{Q}$output" and insert --$\overline{Q}$ output--.

Col. 4, line 27, delete "$\overline{Q}$ pulse" and insert --$\overline{Q}$ pulse--.

Signed and Sealed this

Ninth Day of September, 1997

Attest:

BRUCE LEHMAN

*Attesting Officer*  *Commissioner of Patents and Trademarks*